(12) United States Patent
Liu et al.

(10) Patent No.: US 7,928,020 B2
(45) Date of Patent: Apr. 19, 2011

(54) METHOD OF FABRICATING A NITROGENATED SILICON OXIDE LAYER AND MOS DEVICE HAVING SAME

(75) Inventors: Jinping Liu, Singapore (SG); Ben Ong, Singapore (SG); Zhengquan Zhang, Singapore (SG); Jae Gon Lee, Summerhill (SG); Lydia Wong, Singapore (SG); Bin Yang, Singapore (SG); K. H. Alex See, Singapore (SG); Meisheng Zhou, Singapore (SG); Liang Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 677 days.

(21) Appl. No.: 11/862,865

(22) Filed: Sep. 27, 2007

(65) Prior Publication Data

US 2009/0088002 A1 Apr. 2, 2009

(51) Int. Cl.
*H01L 21/00* (2006.01)

(52) U.S. Cl. .................. 438/788; 438/787; 438/660

(58) Field of Classification Search .................. 438/788, 438/787, 660
See application file for complete search history.

(56) References Cited

U.S. PATENT DOCUMENTS

| | | | |
|---|---|---|---|
| 5,861,329 A | 1/1999 | Yeh et al. | |
| 6,040,249 A * | 3/2000 | Holloway | 438/769 |
| 6,136,654 A * | 10/2000 | Kraft et al. | 438/287 |
| 6,140,187 A | 10/2000 | DeBusk et al. | |
| 6,162,717 A | 12/2000 | Yeh | |
| 6,211,045 B1 * | 4/2001 | Liang et al. | 438/585 |
| 6,225,169 B1 | 5/2001 | Chew et al. | |
| 6,261,973 B1 * | 7/2001 | Misium et al. | 438/775 |
| 6,773,999 B2 * | 8/2004 | Yoneda | 438/287 |
| 7,153,736 B2 * | 12/2006 | Eppich et al. | 438/240 |
| 7,153,746 B2 * | 12/2006 | Moore et al. | 438/287 |
| 7,157,778 B2 * | 1/2007 | Moore | 257/392 |
| 7,164,178 B2 * | 1/2007 | Yoneda | 257/411 |
| 7,176,094 B2 | 2/2007 | Zhong et al. | |
| 7,202,164 B2 * | 4/2007 | Liu et al. | 438/660 |
| 7,371,647 B2 * | 5/2008 | Beaman et al. | 438/287 |
| 7,399,714 B2 * | 7/2008 | Beaman et al. | 438/775 |
| 7,432,166 B2 * | 10/2008 | Sandhu et al. | 438/287 |
| 7,459,757 B2 * | 12/2008 | Sandhu et al. | 257/405 |
| 2006/0110865 A1 * | 5/2006 | Liu et al. | 438/151 |
| 2009/0088002 A1 * | 4/2009 | Liu et al. | 438/788 |

* cited by examiner

*Primary Examiner* — Laura M Menz
(74) *Attorney, Agent, or Firm* — Brinks Hofer Gilson & Lione

(57) ABSTRACT

A method for fabricating a nitrogen-containing dielectric layer and semiconductor device including the dielectric layer in which a silicon oxide layer is formed on a substrate, such that an interface region resides adjacent to substrate and a surface region resides opposite the interface region. Nitrogen is introduced into the silicon oxide layer by applying a nitrogen plasma. After applying nitrogen plasma, the silicon oxide layer is annealed. The processes of introducing nitrogen into the silicon oxide layer and annealing the silicon oxide layer are repeated to create a bi-modal nitrogen concentration profile in the silicon oxide layer. In the silicon oxide layer, the peak nitrogen concentrations are situated away from the interface region and at least one of the peak nitrogen concentrations is situated in proximity to the surface region. A method for fabricating a semiconductor device is incorporating the nitrogen-containing silicon oxide layers also disclosed.

23 Claims, 4 Drawing Sheets

METHOD OF FABRICATING A NITROGENATED SILICON OXIDE LAYER AND MOS DEVICE HAVING SAME

TECHNICAL FIELD

The invention relates, generally, to MOS devices having thin gate dielectric layers and, more particularly, to the fabrication of MOS devices having nitrogen-containing, silicon oxide gate dielectric layers.

BACKGROUND

Advanced metal-oxide-semiconductor (MOS) devices require very thin gate dielectric layers that have a thickness on the order of 30 angstroms or less, and that exhibit low leakage currents. Recently high k dielectric materials have been investigated as an alternative to silicon dioxide for use as gate dielectric layers in MOS devices. The high k materials have a higher dielectric constant k than silicon dioxide. This feature enables the further scaling of MOS transistors to smaller dimensions. Equivalent Oxide Thickness (EOT) is a number used to compare performance of MOS transistors having a high-k dielectric layer with the performance of MOS transistors having silicon dioxide gate dielectric layer. The EOT is the thickness of a silicon dioxide gate oxide needed to obtain the same gate capacitance as that obtained with a dielectric having a higher dielectric constant k. For example an EOT of 1 nm would result from the use a 10 nm thick dielectric with a k of 39 (the k of $SiO_2$ is 3.9).

While high-k dielectric materials offer better capacitance than silicone dioxide, these materials are not compatible with the polycrystalline silicon commonly used as a gate electrode material. The electronic conduction band structure of polycrystalline silicon does not match well with high k materials. Accordingly, a metal gate structure is required in MOS devices having a high k gate dielectric in order to fully realize the potential performance improvement. Fabricating the required metal gate structure is expensive and requires advanced metal deposition technology.

In view of the difficulty in incorporating high k dielectric materials in MOS devices, silicon dioxide continues to be used as MOS devices are scaled to smaller geometries. As the EOT of the silicon oxide layer falls below about 20 angstroms, it becomes mandatory to reduce the oxide leakage current. One method of reducing leakage is to include nitrogen in the silicon oxide layer, in which a nitridation process is used to form a silicon oxynitride (SiON) layer. SiON exhibits a relatively high dielectric constant because of nitrogen incorporation and offers reduced leakage currents at an equivalent EOT.

Decoupled-plasma nitridation (DPN) is an emerging new technology for incorporating ultra-high concentrations of nitrogen at the top surface layer of an ultra-thin gate oxide. This process uses inductive coupling for plasma formation. Radio frequency (RF) power is transferred to the plasma via an RF magnetic field, which, in turn, generates an ionizing electric field. Inductive coupling is much more efficient for plasma production than a direct electrode plasma since energy is not dissipated in driving ions into the electrode surfaces.

Introducing nitrogen into a silicon oxide gate layer by DPN improves the nitrogen uniformity and oxide leakage current considerably. While the DPN process advantageously operates at low temperatures, a post nitridation anneal (PNA) is required to remove low-temperature induced defects in the SiON layer. Hence, post-DPN annealing at a relatively high temperature is required to eliminate the defects and improve the oxide integrity.

Several prior art references disclose plasma nitridation processes. For example, U.S. Pat. No. 6,140,187 to DeBusk et al. discloses a remote plasma nitridation process for a gate oxide. A He/Ar plasma is used followed by an anneal in oxygen at about 800° C. In U.S. Pat. No. 5,861,329 to Yeh, a plasma process for forming a barrier layer is discloses. Gases used in the process include nitrogen, ammonia, nitrogen oxide, and nitrogen/oxygen mixtures. U.S. Pat. No. 6,225,169 to Chew discloses a RTN process in which the nitrided layer is formed on the sidewalls of the gate structure, while U.S. Pat. No. 6,162,717 to Yeh et al. discloses a high density plasma process in which the gate dielectric becomes sandwiched between two layers of silicon nitride.

U.S. Pat. No. 7,176,094 to Zhong et al., and assigned to the instant assignee, discloses the formation of a nitrided silicon oxide layer by DPN and PNA in which the PNA is carried out in a 1:4 oxygen-nitrogen mixture. The nitridation process produces a gate oxide layer that is resistant to boron penetration.

Research has shown that increased nitrogen concentrations improve the performance of SiON material as a gate dielectric material. As the total nitrogen concentration increase, however, excessive amounts of nitrogen appear at the oxide/silicon interface, which degrades the SiON performance. The nitrogen build-up at the interface leads to a trade off between fabricating SiON layers having either low gate leakage or low EOT. When one is reduced, the other increases. While substantial work in the development of nitrided oxide layers for use as a gate dielectric in MOS devices has shown this material to be an effective alternative to silicon dioxide, a need existed to improve the total nitrogen concentration and nitrogen profile in SiON gate dielectric layers

SUMMARY

In one embodiment, a method for fabricating a nitrogen-containing dielectric layer includes forming a silicon oxide dielectric layer on a substrate whereby an interface region resides adjacent the substrate and a surface region resides opposite the interface region. Nitrogen is introduced into the silicon oxide dielectric layer by applying a nitrogen plasma. After applying the nitrogen plasma, the silicon oxide dielectric layer is annealed. This process is repeated at least one time to form a nitrogen concentration profile in the silicon oxide dielectric layer. The nitrogen concentration profile is characterized by a bimodal distribution, such that peak nitrogen concentrations are situated away from the interface region and at least one of the peak nitrogen concentrations is in proximity to the surface region.

In another embodiment, a method for fabricating a semiconductor device includes forming a silicon oxide dielectric layer on a substrate whereby an interface region resides adjacent the substrate and a surface region resides opposite the interface region. Nitrogen is introduced into the silicon oxide dielectric layer by applying a nitrogen plasma. After applying the nitrogen plasma, the silicon oxide dielectric layer is annealed. This process is repeated at least one time to form an SiON layer having a nitrogen concentration profile characterized by a bimodal distribution, such that the peak nitrogen concentrations are situated away from the interface region and at least one of the peak nitrogen concentrations is in proximity to the surface region. After forming the SiON layer, a gate electrode is formed on the SiON layer.

In yet another embodiment, a method for fabricating a gate dielectric layer includes forming an SiON layer on a substrate, whereby an interface region resides adjacent the substrate and a surface region resides opposite the interface region. The SiON layer has a nitrogen concentration profile characterized by a bimodal distribution, such that peak nitrogen concentrations are situated away from the interface region and at least one of the peak nitrogen concentrations is in proximity to the surface region.

DETAILED DESCRIPTION

The nitrogentated silicon oxide layer will be referred to herein as an SiON layer. This chemical nomenclature, however, is not intended to imply that the nitrogenated silicon oxide layers of the invention have an exact stiochiometric relationship. The term "SiON layer" refers to all forms of nitrogen-containing silicon oxide, nitrogen-containing silicon dioxide, silicon oxynitride, and the like.

In accordance with an embodiment of the invention, an SiON layer is fabricated through the use of a process in which a silicon oxide layer is formed on a substrate. Once formed on the substrate, the silicon oxide layer is then subjected to a process in which nitrogen is introduced into the silicon oxide layer followed by an annealing process. The nitrogen introduction process and the subsequent annealing process are repeated as necessary to obtain a desired nitrogen concentrated profile in the silicon oxide layer.

As will subsequently be described in more detail, the nitrogen introduction process and the subsequent annealing process are carried out in a manner that produces a nitrogen concentration profile in the silicon oxide layer that exhibits characteristics of a bi-model distribution. SiON layers having a bi-model nitrogen concentration profile provide improved performance characteristics when incorporated as a dielectric layer in an MOS device. For example, MOS devices having SiON layers fabricated in accordance with the invention exhibit reduced leakage current compared to MOS devices having dielectric layers of the prior art having the same EOT. Alternatively, MOS devices having SiON layers fabricated in accordance with the invention exhibit lower EOT at comparable leakage current. This is significant when compared with nitrogenated silicon oxide layers of the prior art in which reduced leakage current comes at the cost of higher EOT, or alternatively, reduced EOT comes at the expense of higher leakage current.

Figure 1:
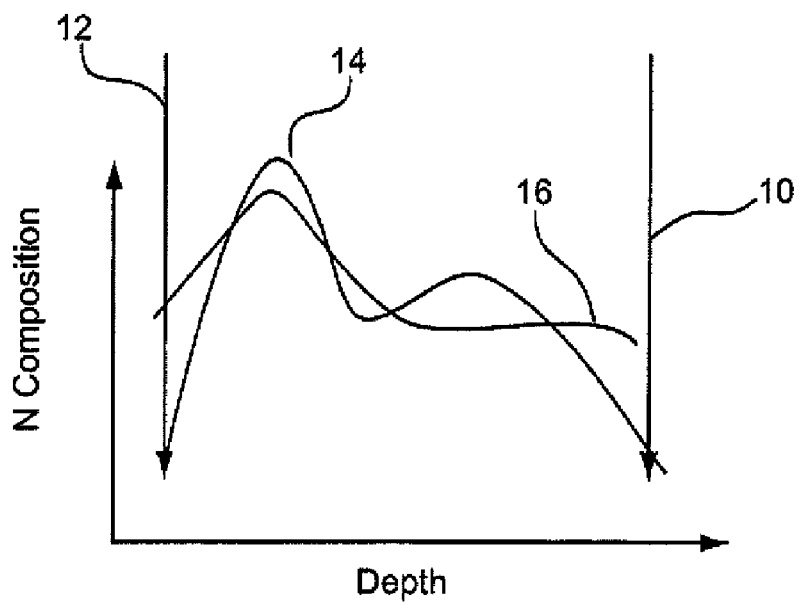
FIG. 1 is a comparative plot of nitrogen concentration versus depth in an SiON layer formed in accordance with an embodiment of the invention and the an SiON layer formed according to the prior art.

A plot of nitrogen concentration versus depth in an SiON layer formed in accordance with an embodiment of the invention is illustrated in FIG. 1. The plot schematically shows the location of an interface 10 between the SiON layer and the substrate as vertical line and a surface 12 of the SiON layer, also shown by a vertical line. Nitrogen concentration profile 14 schematically illustrates the bi-model nitrogen concentration profile obtained in SiON layers fabricated in accordance with an embodiment of the invention. For comparison, nitrogen concentration profile 16 shows a typical nitrogen concentration profile in SiON layers of the prior art. Importantly, nitrogen concentration profile 14 shows reduced nitrogen concentrations at the interface 10 between the SiON layer and the substrate. Further, nitrogen concentration profile 14 shows a buildup of nitrogen toward the SiON surface 12. Accordingly, SiON layers fabricated in accordance with the invention exhibit high nitrogen concentration at the surface and reduce nitrogen concentration at the substrate interface.

The desirable nitrogen concentration profile of SiON layers fabricated in accordance with the invention is produced through a repeated cycle of nitrogen introduction and annealing. In accordance with one embodiment of the invention, nitrogen is introduced into a silicon oxide layer by subjecting a silicon oxide layer to a nitrogen plasma. Those skilled in the art will appreciate that different plasma process methods exist for introducing nitrogen into a silicon oxide layer. For example, plasma-enhanced-chemical-vapor-deposition (PECVD) methods can be used in which substrates are subjected to a plasma atmosphere in a conventional chemical vapor deposition apparatus. Further, parallel plate plasma deposition systems can also be used to introduce nitrogen into a dielectric material. Preferably, a decoupled plasma nitridation (DPN) process is used to introduce nitrogen into the silicon oxide layer. In the DPN nitrogen plasma system, inductive coupling is used to form a nitrogen plasma, rather than subjecting the substrate to a direct RF field. RF power is transferred to the plasma through an RF magnetic field that generates the nitrogen plasma in a location remote from the substrate. Reactive nitrogen plasma gas is then transported to the substrate where nitrogen introduction takes place from the nitrogen plasma into the silicon oxide layer.

Figure 2:
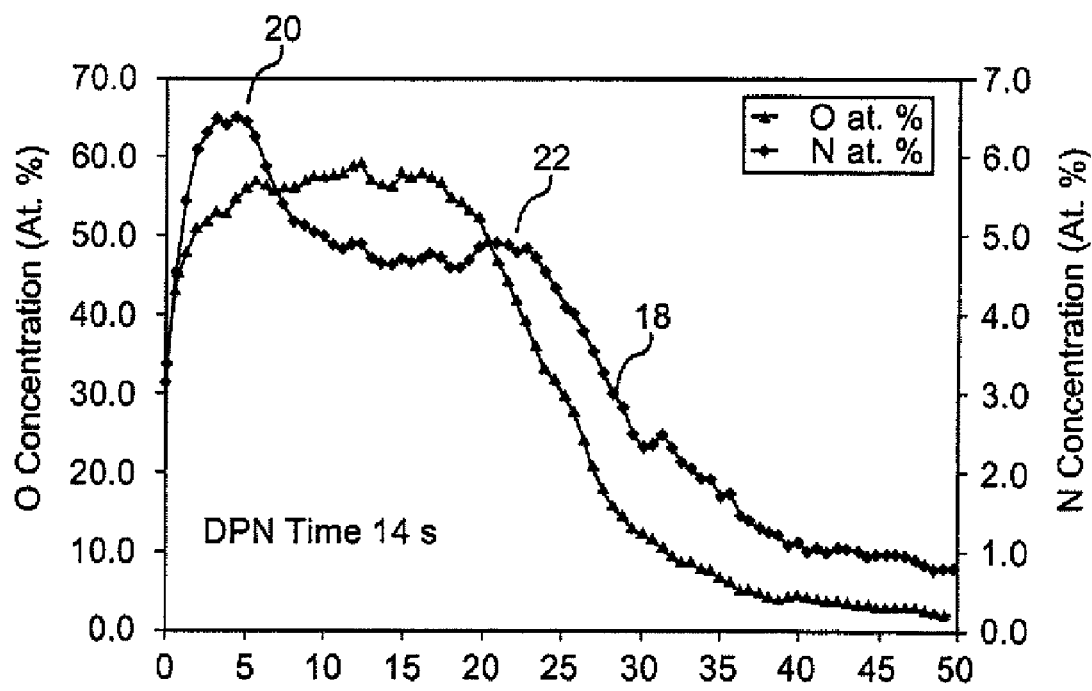
FIGS. 2-4 are plots of oxygen and nitrogen concentrations versus depth in SiON layers formed in accordance with an embodiment of the invention for varying DPN annealing time.
Figure 3:
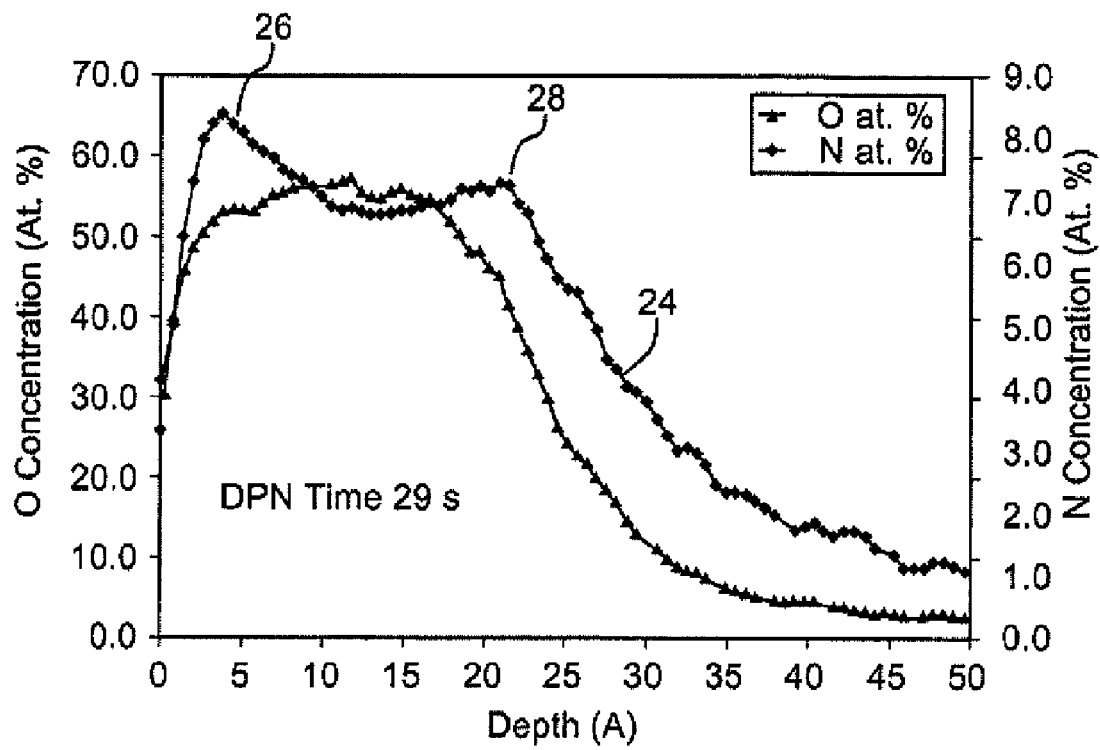
Figure 4:
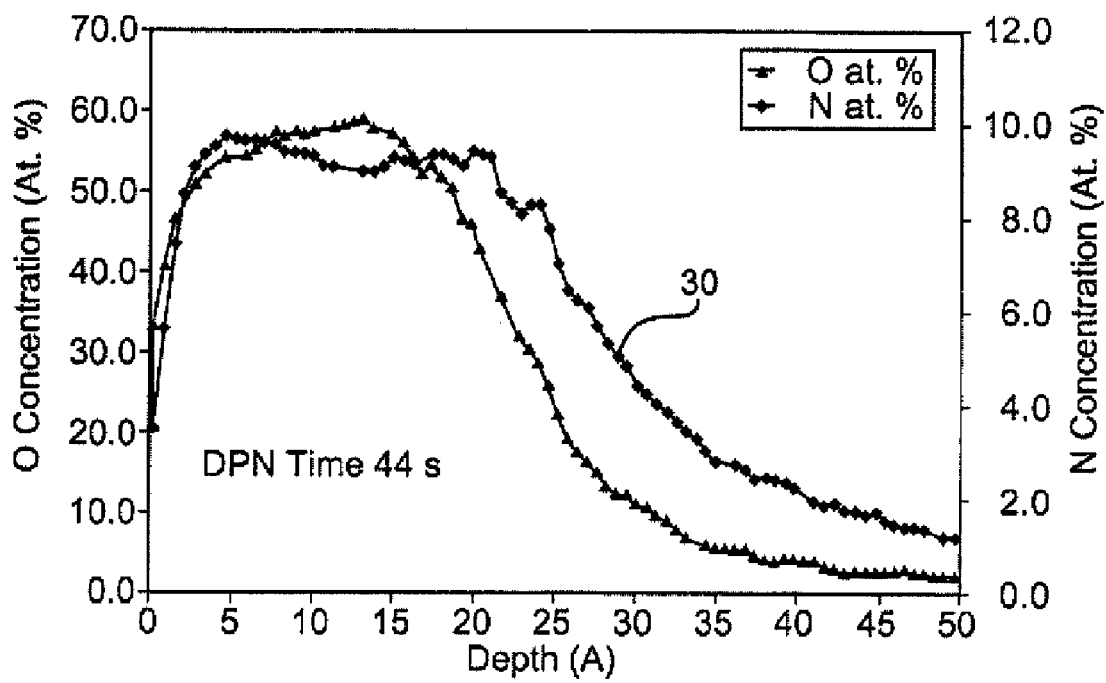

The amount of nitrogen introduced into the silicon oxide layer and the concentration profile of the nitrogen in the silicon oxide layer is dependent, in part, upon the exposure time to the nitrogen plasma. FIGS. 2-4 are plots of nitrogen concentration and oxygen concentration in a nitrogentated silicon dioxide layer. In each case, nitrogen was introduced using a DPN process, and plasma exposure time was the only DPN parameter that varied from one sample to the next. FIG. 2 shows the nitrogen and oxygen concentration profile for a nitrogen plasma exposed time of 14 seconds. The plot shows a build-up of nitrogen in the silicon dioxide layer near the surface of the silicon dioxide layer, as indicated by nitrogen concentration profile 18. Further, nitrogen concentration profile 18 shows a bi-model nitrogen concentration distribution with a first peak concentration 20 near the silicon dioxide surface, and a second peak nitrogen concentration 22 at a depth of about 20 to about 25 angstroms from the silicon dioxide surface.

FIG. 3 is a plot of nitrogen and oxygen concentration profiles in a silicon dioxide layer upon exposure to the nitrogen plasma for 29 seconds. In similarity to the plot illustrated in FIG. 2, nitrogen concentration profile 24 in FIG. 3 shows a bi-model distribution in which a first peak nitrogen concentration 26 resides near the silicon dioxide surface and a second peak nitrogen concentration 28 occurs at a depth of about 20 angstroms from the silicon dioxide surface.

Nitrogen concentration profile 30 shown in FIG. 4 results from a nitrogen plasma exposure time of 44 seconds. As indicated by a comparison with the nitrogen concentration profiles shown in FIGS. 2 and 3, increased nitrogen plasma exposure time results in a flattening of the nitrogen concentration profile in the silicon dioxide layer. A comparison with the nitrogen concentration profiles illustrated in FIGS. 2 and 3, with that of FIG. 4 shows a marked flattening of the nitrogen profile in FIG. 4, such that the distinct bi-model concentration profile is much less evident. Accordingly, increasing the nitrogen plasma exposure time results in a more constant nitrogen concentration with depth in the silicon dioxide layer and a marked reduction in the nitrogen concentration near the surface of the silicon dioxide layer. In contrast, the oxygen concentration profiles of FIGS. 2, 3, and 4 show very little change as the plasma exposure time is increased.

Figure 5:
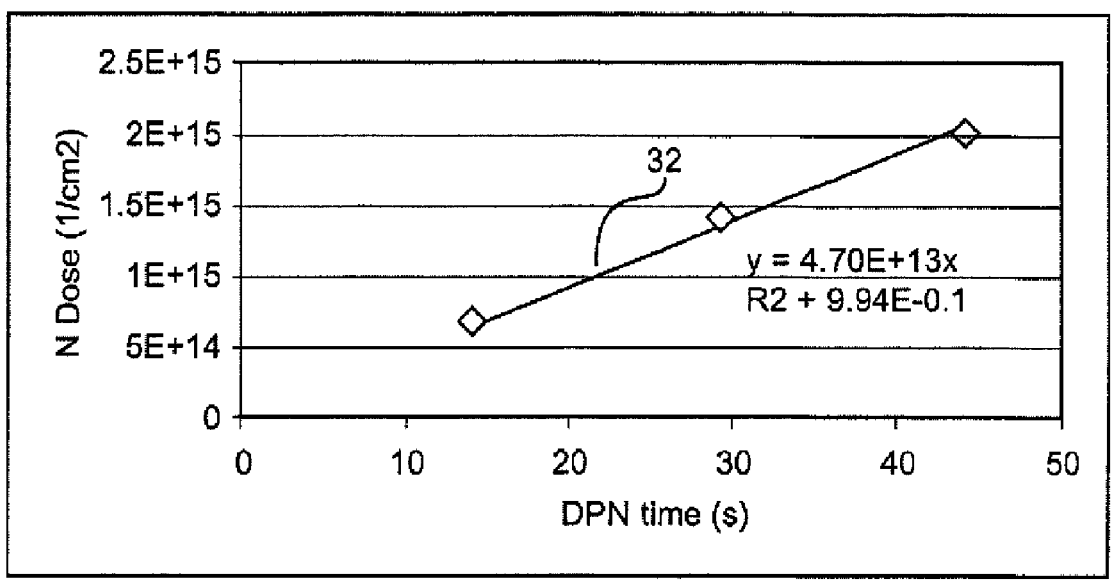
FIG. 5 is a plot of total nitrogen concentration versus DPN annealing time for SiON layers formed in accordance with an embodiment of the invention.

FIG. 5 illustrates a plot of nitrogen dose versus nitrogen plasma exposure time in a silicon dioxide layer subjected to a DPN process in accordance with an embodiment of the invention. As shown by linear plot 32 in FIG. 5, the total nitrogen dose increases with increasing nitrogen plasma exposure time. Accordingly, the total amount of nitrogen introduced in the silicon dioxide layer will increase with increasing nitrogen plasma exposure time.

Figure 6:
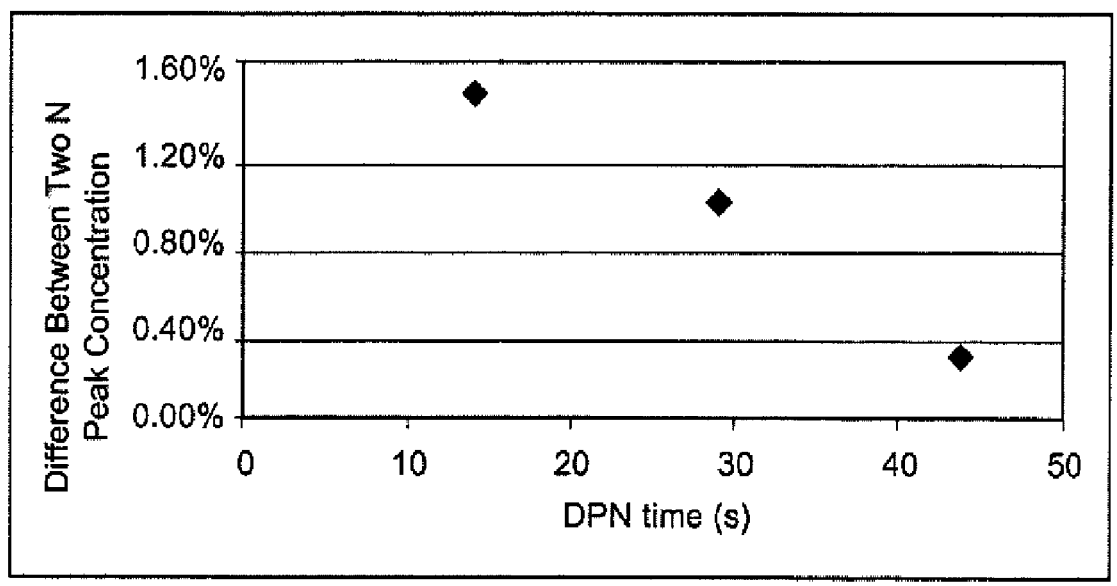
FIG. 6 is a plot of the relative location of two concentration peaks versus DPN annealing time for SiON layers formed in accordance with an embodiment of the invention.

FIG. 6 is a plot of the spatial difference in the two peak nitrogen concentrations in the bi-model nitrogen concentration profile within the silicon dioxide layer as a function of nitrogen plasma exposure time. As shown in FIG. 6, as the nitrogen plasma exposure time increases the peak nitrogen concentrations become less spatially distinct and tend to merge together. Thus, while the total amount of nitrogen in the silicon oxide layer increases with exposure time, the nitrogen profile changes in an undesirable way.

To achieve a high nitrogen concentration, while maintaining a relatively large nitrogen concentration at the silicon dioxide surface, the inventors have surprisingly discovered that the desirable bi-model nitrogen concentration distribution in a silicon oxide layer can be preserved through repeated nitrogen plasma exposure followed post nitridation annealing (PNA). Although not wishing to be bound by any particular theory of their invention, the inventors believe that the nitrogen initially introduced by the nitrogen plasma is weakly bonded within the silicon oxide layer during the initial nitrogen plasma exposure. Subsequent annealing, however, creates stronger nitrogen bonds, which reduces the nitrogen diffusion in the silicon oxide layer. Accordingly, the formation of stronger nitrogen bonds and reduced nitrogen diffusion as a result of the annealing process combines to fix the initial nitrogen concentration profile in the silicon oxide layer.

In accordance with one embodiment of the invention, a process is carried out in which nitrogen is introduced into the silicon oxide layer by applying a nitrogen plasma followed by annealing the silicon oxide layer. The process of introducing nitrogen into the silicon oxide layer and annealing the silicon oxide layer is repeated at least one time to form a bi-model nitrogen concentration distribution in the silicon oxide layer. The SiON layers are characterized by peak nitrogen concentrations situated away from the interface region between the silicon oxide layer and the substrate, and where at least one of the peak nitrogen concentrations is located in proximity to the surface of the silicon oxide layer. The inventive process results in a total nitrogen concentration in the silicon oxide layer of preferably about 5 to about 25 atomic % nitrogen and, more preferably, about 5 to about 8 atomic % nitrogen. Further, the inventive process results in an EOT of preferably about 10 to about 20 angstroms.

The annealing process is preferably carried out at least initially in a nitrogen atmosphere and at least the final annealing process is performed in an oxygen-containing atmosphere. In one embodiment, substantially pure nitrogen is used in at least the first annealing step, where the nitrogen atmosphere can contain small amounts of oxygen. The nitrogen in the annealing atmosphere supplements the nitrogen introduction in the plasma to incorporate nitrogen in the silicon oxide layer and to bond the nitrogen in the silicon oxide. An oxygen-containing atmosphere used in at least the final annealing step is preferably provided by a nitrous oxide ($N_2O$) atmosphere. The nitrous oxide produces oxygen radicals in the silicon oxide layer that are believed beneficial in the nitrogen bonding process within the silicon oxide layer during nitrogen introduction.

The inventive process repeats the steps of introducing nitrogen into the silicon oxide layer and annealing the silicon oxide layer in a number of repeated cycles. In accordance with one embodiment, the introduction and annealing steps are repeated at least three times. The repeated steps, however, can be carried out from one repetition up to and including any number of repetitions necessary to achieve the desired nitrogen concentration profile in the silicon oxide layer. Although the DPN process and the PNA process can be each carried out for a varying length of time, in a preferred embodiment, the DPN process is carried out for about 7 seconds and the PNA process is carried out for about 5 seconds.

Figure 7:
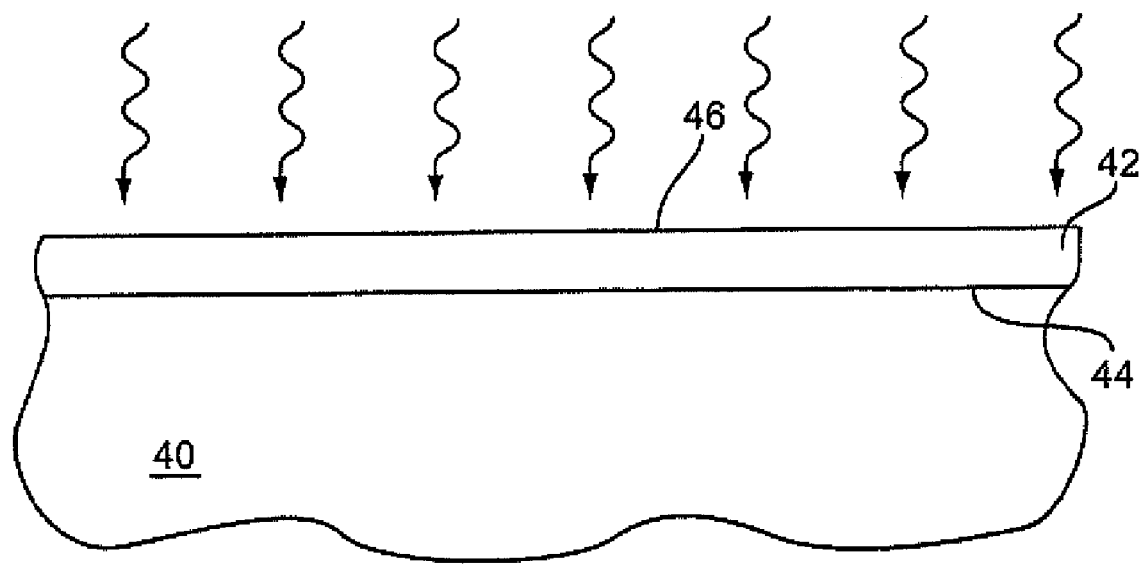
FIG. 7 illustrates, in cross-section, a semiconductor substrate having an SiON layer fabricated in accordance with an embodiment of the invention.

The inventive process further contemplates the fabrication of MOS devices in which the gate dielectric layer is fabricated using the plasma nitridation and annealing processes described above. FIG. 7 illustrates a semiconductor substrate 40 having a silicon oxide gate dielectric layer 42 overlying a principle surface 44 of semiconductor substrate 40. Preferably, silicon oxide layer 42 is formed by a rapid thermal oxidation process in which principle surface 44 is oxidized at a temperature of about 950° C. and pressure of about 120 torr. The rapid thermal oxidation process is preferably carried out for about 20 seconds. Those skilled in the art will recognize that silicon oxide layers can be formed by other processes such as conventional thermal oxidation. Further, those skilled in the art will appreciate that the rapid thermal oxidation process described above is exemplary and that different rapid thermal oxidation parameters can be used to form silicon oxide layer 42.

In accordance with an embodiment of the invention, nitrogen is introduced into silicon oxide layer 42 by exposing surface 46 to a nitrogen plasma. Preferably the nitrogen plasma is provided by DPN process carried out at about 30 militorr and an effective RF power of about 200 watts. The nitrogen plasma is formed by introducing about 500 sccm of nitrogen into the plasma system for about 7 seconds. Those skilled in the art will recognize that a nitrogen plasma can be provided by various types of plasma deposition systems, including PECVD systems and the like. Further, although particular preferred DPN operating parameters are described, those skilled in the art will recognize that different operating parameters can be used to introduce nitrogen into silicon oxide layer 42.

Following the nitrogen introduction step, a PNA process is carried out at about 1050° C. and, preferably, for about 5 seconds.

In accordance with the invention, the DPN and PNA processes are repeated to form a desired nitrogen concentration profile in silicon oxide layer 42. In accordance with one embodiment of the invention, the DPN and PNA processes are repeated for a total of three successive repetitions. The first PNA is carried out in a substantially nitrogen atmosphere and at least the final PNA is carried out in an oxygen-containing atmosphere. The inventive process produces an SiON layer having an EOT of about 12 angstroms.

Once silicon oxide layer 42 is nitrogenated to form an SiON layer, a gate electrode 48 is formed to overlie surface 46 of SiON layer 42. Gate electrode 48 is formed by depositing a gate electrode material onto surface 46, followed by a patterning and etching process. Those skilled in the art will appreciate that numerous different materials can be used to form gate electrode 48. These materials include polycrystalline silicon, refractory metals, refractory metal silicides, and the like. Further, gate electrode 48 can be formed by multiple layers of materials including copper and the like. Additionally, various kinds of known lithographic processes and etching processes can be used to form gate electrode 48.

Figure 8:
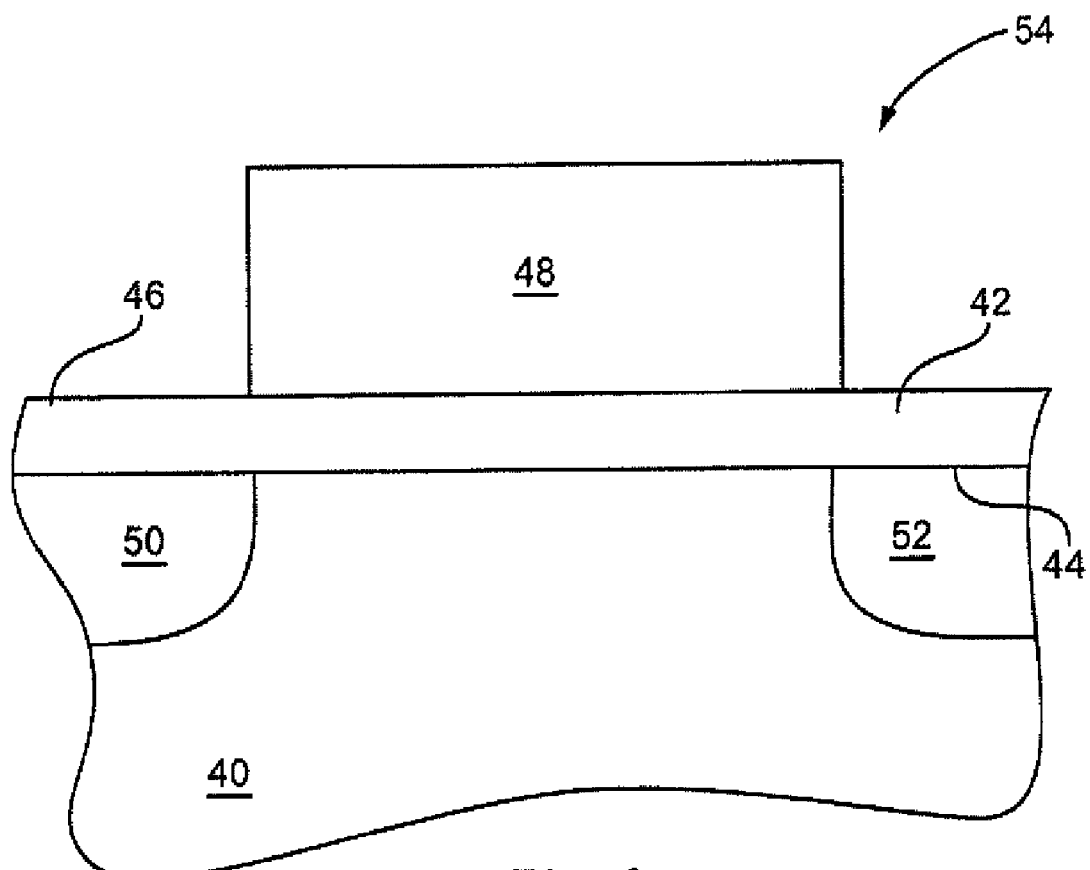
FIG. 8 illustrates, in cross-section, an MOS device including a gate electrode formed on the SiON layer of FIG. 7.

After gate electrode 48 is formed, a source region 50 and a drain region 52 are formed in semiconductor substrate 40. Further, source/drain extension regions (not shown) can also be formed in semiconductor substrate 40 adjacent to the source and drain regions. The elements illustrated in FIG. 8 represent the operative components of an MOS transistor 54. In accordance with the invention various additional components can also be fabricated to form an MOS device, such as an integrated circuit, a microprocessor, a logic device, and the like. MOS transistor 54 advantageously displays low leakage current and a low EOT.

Thus, it is apparent that there has been described in accordance with the various embodiments of the invention, a method for fabricating a nitrogenated silicon oxide layer and an MOS device including the nitrogenated silicon oxide layer that fully provides the advantages set forth above. Those skilled in the art will recognize that variations and modifications can be made without departing from the spirit and scope of the invention. For example, additional processes, such as surface cleaning processes, surface activation processes, and the like can be incorporated into the inventive fabrication method. Accordingly, all such variations and modifications are included within the scope of the appended claims and equivalence thereof.

The invention claimed is:

1. A method for fabricating a nitrogen-containing dielectric layer comprising:
    a) forming a silicon oxide dielectric layer on a substrate whereby an interface region resides adjacent the substrate and a surface region resides opposite the interface region;
    b) introducing nitrogen into the silicon oxide dielectric layer by applying a nitrogen plasma; and
    c) annealing the silicon oxide dielectric layer after applying the nitrogen plasma, and
    repeating steps b) and c) at least one time to form a nitrogen concentration profile in the silicon oxide dielectric layer,
    wherein at least a final annealing step is carried out in an oxygen-containing atmosphere, and
    wherein the nitrogen concentration profile is characterized by a bi-modal distribution, such that peak nitrogen concentrations are situated away from the interface region and at least one of the peak nitrogen concentrations is in proximity to the surface region.

2. The method of claim 1, wherein steps b) and c) provide a nitrogen-containing silicon oxide comprising about 5 to about 25 atomic % nitrogen.

3. The method of claim 1, wherein steps b) and c) provide a nitrogen-containing silicon oxide comprising about 5 to about 8 atomic % nitrogen.

4. The method of claim 1, wherein steps b) and c) provide a nitrogen-containing silicon oxide comprising an equivalent oxide thickness of about 10 to about 20 angstroms.

5. The method of claim 1, wherein at least a first annealing step is carried out in substantially pure nitrogen atmosphere.

6. The method of claim 1, wherein at least one annealing step comprises annealing in an $N_2O$ atmosphere.

7. The method of claim 6, wherein annealing in an $N_2O$ atmosphere comprises introducing oxygen radicals into the silicon oxide dielectric layer.

8. The method of claim 1, wherein forming a silicon oxide dielectric layer comprises rapid thermal oxidation of the substrate in an oxidation atmosphere comprising $N_2O$.

9. The method of claim 1, wherein repeating steps b) and c) comprises repeating steps b) and c) at least three times.

10. The method of claim 1, wherein applying a nitrogen plasma comprises applying a decoupled plasma nitridation process.

11. The method of claim 1, wherein introducing nitrogen into the silicon oxide dielectric layer comprises applying a nitrogen plasma for about 7 seconds, and wherein annealing the silicon oxide dielectric layer comprises annealing for about 5 seconds.

12. A method for fabricating a semiconductor device comprising:
    a) forming a silicon oxide dielectric layer on a substrate whereby an interface region resides adjacent the substrate and a surface region resides opposite the interface region;
    b) introducing nitrogen into the silicon oxide dielectric layer by applying a nitrogen plasma;
    c) annealing the silicon oxide dielectric layer after applying the nitrogen plasma, and
    repeating steps b) and c) at least one time to form an SiON layer having a nitrogen concentration profile characterized by a bi-modal distribution, such that the peak nitrogen concentrations are situated away from the interface region and at least one of the peak nitrogen concentrations is in proximity to the surface region,
    wherein at least a final annealing step is carried out in an oxygen-containing atmosphere; and
    d) forming a gate electrode on the SiON layer.

13. A method for fabricating a gate dielectric layer comprising:
    forming a nitrogen-containing dielectric layer on a substrate according to the following steps:
    a) introducing nitrogen into a silicon oxide dielectric layer by applying a nitrogen plasma; and
    b) annealing the silicon oxide dielectric layer after applying the nitrogen plasma, and repeating steps a) and b) at least one time,
    wherein at least a final annealing step is carried out in an oxygen-containing atmosphere,
    whereby an interface region resides adjacent the substrate and a surface region resides opposite the interface region, wherein the nitrogen-containing dielectric layer has a nitrogen concentration profile characterized by a bi-modal nitrogen concentration distribution, such that peak nitrogen concentrations are situated away from the interface region and at least one of the peak nitrogen concentrations is in proximity to the surface region.

14. The method of claim 13, wherein annealing the silicon oxide dielectric layer comprises annealing in an $N_2O$ atmosphere and introducing oxygen radicals into the silicon oxide dielectric layer.

15. The method of claim 13, wherein repeating steps b) and c) comprises repeating steps b) and c) at least three times, and wherein at least the first annealing step is carried out in a substantially pure nitrogen atmosphere and at least the final annealing step is carried out in an oxygen-containing atmosphere.

16. The method of claim 12, wherein forming a gate electrode comprises forming a polysilicon gate electrode.

17. The method of claim 13, wherein applying a nitrogen plasma comprises applying a decoupled plasma nitridation process.

18. The method of claim 13, wherein at least the first annealing step is carried out in a substantially pure nitrogen atmosphere.

19. The method of claim 13, wherein forming a nitrogen-containing dielectric layer comprises forming an SiON layer comprising about 5 to about 25 atomic % nitrogen.

20. The method of claim 13, wherein forming a nitrogen-containing dielectric layer comprises forming an SiON layer comprising about 5 to about 8 atomic % nitrogen.

21. The method of claim 13, wherein forming a nitrogen-containing dielectric layer comprises forming an SiON layer having an equivalent oxide thickness of about 10 to about 20 angstroms.

22. A method for fabricating a gate dielectric layer comprising:
   forming a silicon oxide layer on a substrate, wherein an interface regions resides adjacent the substrate and a surface region resides opposite the interface region;
   introducing nitrogen into the silicon oxide layer and annealing the silicon oxide layer and repeating introducing nitrogen and annealing at least one time to form a nitrogen-containing dielectric layer having a bi-modal nitrogen concentration distribution, such that peak nitrogen concentrations are situated away from the interface region and at least one of the peak nitrogen concentrations is in proximity to the surface region, wherein at least the final annealing step is carried out in an oxygen-containing atmosphere.

23. The method of claim 22, wherein at least a first annealing step is carried out in a substantially pure nitrogen atmosphere.

* * * * *